(12) United States Patent
Lee et al.

(10) Patent No.: US 10,998,281 B2
(45) Date of Patent: May 4, 2021

(54) SEMICONDUCTOR PACKAGES

(71) Applicant: SK hynix Inc., Icheon-si (KR)

(72) Inventors: Jae Hoon Lee, Icheon-si (KR); Sun Kyu Kong, Hwaseong-si (KR); Ji Yeong Yoon, Hwaseong-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/539,602

(22) Filed: Aug. 13, 2019

(65) Prior Publication Data

US 2020/0176406 A1    Jun. 4, 2020

(30) Foreign Application Priority Data

Dec. 3, 2018  (KR) .................. 10-2018-0153938

(51) Int. Cl.
*H01L 23/00* (2006.01)
*H01L 23/522* (2006.01)
*H01L 23/498* (2006.01)

(52) U.S. Cl.
CPC .......... *H01L 24/09* (2013.01); *H01L 23/5226* (2013.01); *H01L 23/49816* (2013.01); *H01L 23/49827* (2013.01); *H01L 24/06* (2013.01); *H01L 24/13* (2013.01); *H01L 24/16* (2013.01); *H01L 2224/0401* (2013.01); *H01L 2224/13016* (2013.01); *H01L 2224/16237* (2013.01)

(58) Field of Classification Search
CPC ............... H01L 23/49827; H01L 24/09; H01L 23/49816; H01L 23/5226; H01L 23/49838; H01L 23/50; H01L 24/06; H01L 23/3128; H01L 24/13; H01L 23/481; H01L 24/16; H01L 24/02; H01L 2224/0401
See application file for complete search history.

(56) References Cited

U.S. PATENT DOCUMENTS

| 8,120,927 | B2 | 2/2012 | Chen et al. | |
|---|---|---|---|---|
| 2005/0098886 | A1* | 5/2005 | Pendse | H01L 23/49838 257/738 |
| 2009/0322441 | A1 | 12/2009 | Chen et al. | |
| 2015/0195906 | A1 | 7/2015 | Chang et al. | |
| 2017/0162516 | A1* | 6/2017 | Joh | H01L 21/565 |
| 2018/0175016 | A1* | 6/2018 | Kim | G03F 7/70633 |
| 2020/0176406 | A1 | 6/2020 | Lee et al. | |

FOREIGN PATENT DOCUMENTS

KR  1020100021899 A  2/2010
KR  1020170054814 A  5/2017

* cited by examiner

*Primary Examiner* — Jasmine J Clark
(74) *Attorney, Agent, or Firm* — William Park & Associates Ltd.

(57) ABSTRACT

A package substrate of a semiconductor package includes second and third pad bonding portions respectively located at both sides of a first pad bonding portion disposed on a substrate body. First to third via landing portions are disposed to be spaced apart from the first to third pad bonding portions. First and second connection trace portions are disposed to be parallel with each other, and a first guard trace portion is disposed to be substantially parallel with the first connection trace portion. The second connection trace portion is connected to the first guard trace portion through a first connection plane portion, and the first connection plane portion connects the second connection trace portion to the second via landing portion. The third pad bonding portion is connected to the third via landing portion through a second connection plane portion.

20 Claims, 7 Drawing Sheets

SEMICONDUCTOR PACKAGES

CROSS-REFERENCE TO RELATED APPLICATIONS

The present application claims priority under 35 U.S.C 119(a) to Korean Application No. 10-2018-0153938, filed on Dec. 3, 2018, which is incorporated herein by references in its entirety.

BACKGROUND

1. Technical Field

The present disclosure generally relates to semiconductor packages.

2. Related Art

Semiconductor packages may be configured to include a semiconductor chip mounted on a package substrate. The package substrate may include a circuit interconnection structure connected to the semiconductor chip. The circuit interconnection structure may be configured to include a ground line, a power line, and signal lines transmitting electrical signals. As fast semiconductor chips operating at a high speed are required in high performance electronic systems, high frequency signals are transmitted through the signal lines of the circuit interconnection structure. The high frequency signals have a relatively short wavelength which causes undesirable crosstalk between the high frequency signals, creating reliability issues.

SUMMARY

According to an embodiment, a semiconductor package includes a package substrate having a substrate body and a semiconductor chip mounted on the package substrate. The package substrate includes second and third pad bonding portions disposed on the substrate body and respectively located at both sides of a first pad bonding portion disposed on the substrate body, first to third via landing portions disposed on the substrate body to be spaced apart from the first to third pad bonding portions, and a first connection trace portion extending to connect the first pad bonding portion to the first via landing portion. The package substrate further includes a second connection trace portion connected to the second pad bonding portion, the second connection trace portion substantially parallel with the first connection trace portion, and a first guard trace portion having an end portion spaced apart from the third pad bonding portion and extending to be substantially parallel with the first connection trace portion. The package substrate also includes a first connection plane portion spaced apart from the first via landing portion, surrounding and electrically bypassing the first via landing portion to connect the second connection trace portion to the first guard trace portion, and connecting the second connection trace portion to the second via landing portion. The package substrate additionally includes a second connection plane portion connecting the third pad bonding portion to the third via landing portion.

DETAILED DESCRIPTION

Figure 1:
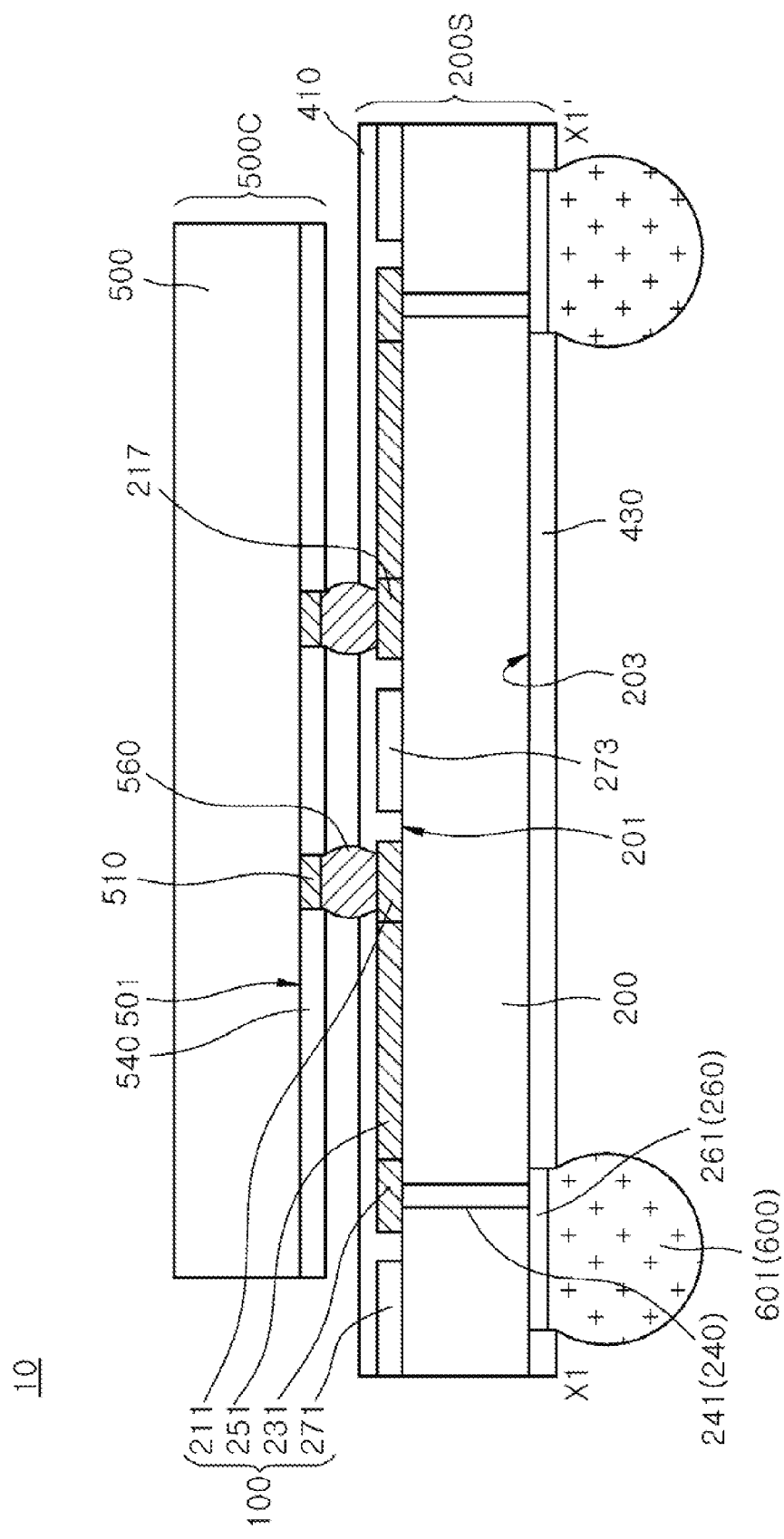
FIG. 1 shows a cross-sectional view illustrating a semiconductor package, according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third," etc. may be used herein to describe various elements, these elements should not be limited by these terms. These terms are only used to distinguish one element from another element and are not used to suggest or define a particular number or sequence of the elements.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a similar fashion (e.g., "between" versus "directly between" or "adjacent" versus "directly adjacent").

Spatially relative terms, such as "beneath," "below," "lower," "above," "upper," "top," "bottom," and the like, may be used to describe an element and/or a feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or under other elements or features would then be oriented above and/or over the other elements or features. The device may be otherwise oriented (rotated 90 degrees or at other orientations) and the spatially relative descriptors used herein interpreted accordingly.

In the following presented embodiments, a semiconductor package may include electronic devices, such as semiconductor chips or semiconductor dies. The semiconductor chips or the semiconductor dies may be obtained by separating a semiconductor substrate, such as a wafer, into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) circuits, which are integrated on the semiconductor substrate. The logic chips may include logic circuits which are integrated on the semiconductor substrate. The semiconductor package may be employed in communication systems, such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
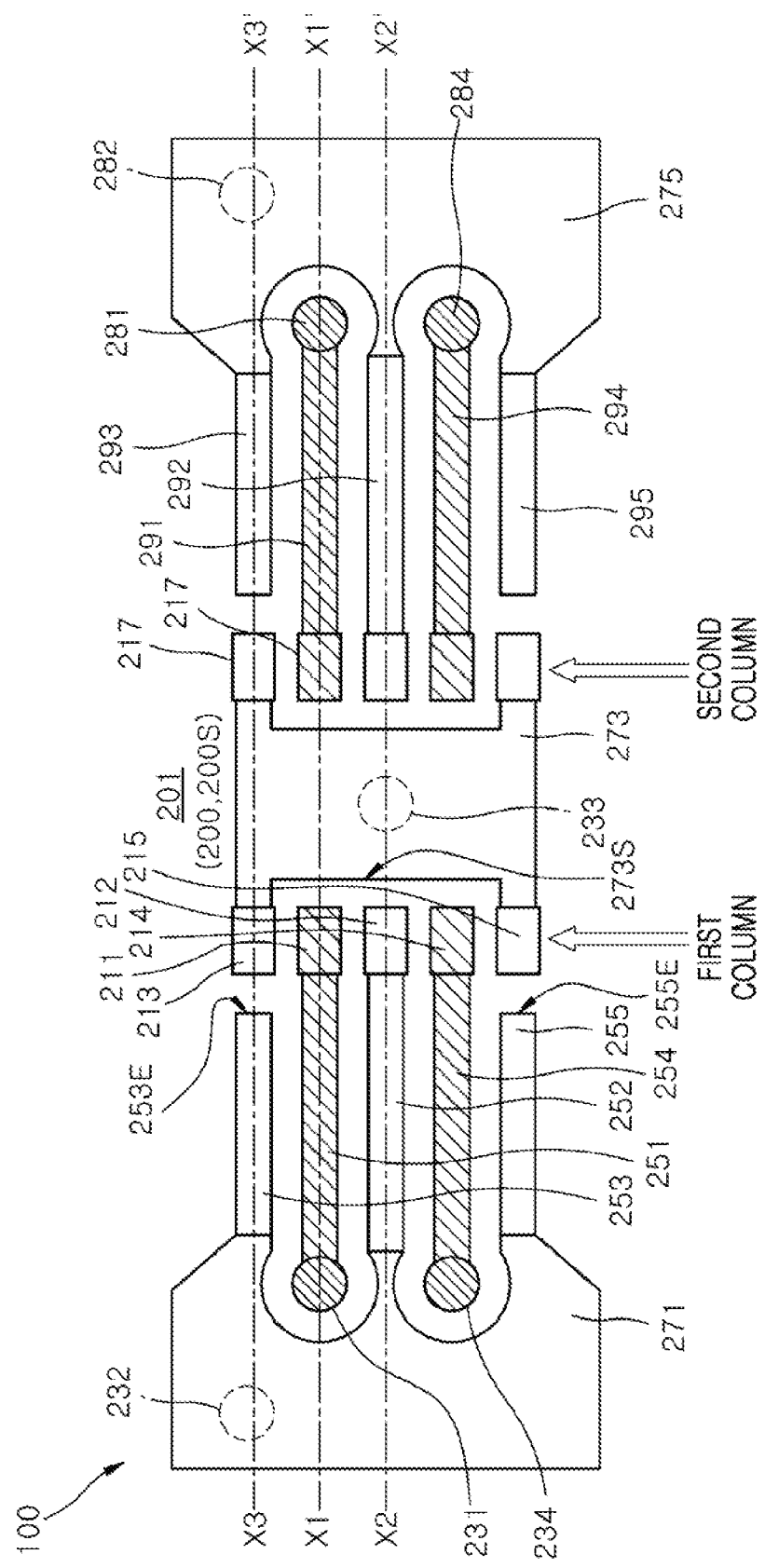
FIG. 2 shows a plan view illustrating a circuit interconnection structure of a semiconductor package, according to an embodiment.
Figure 3:
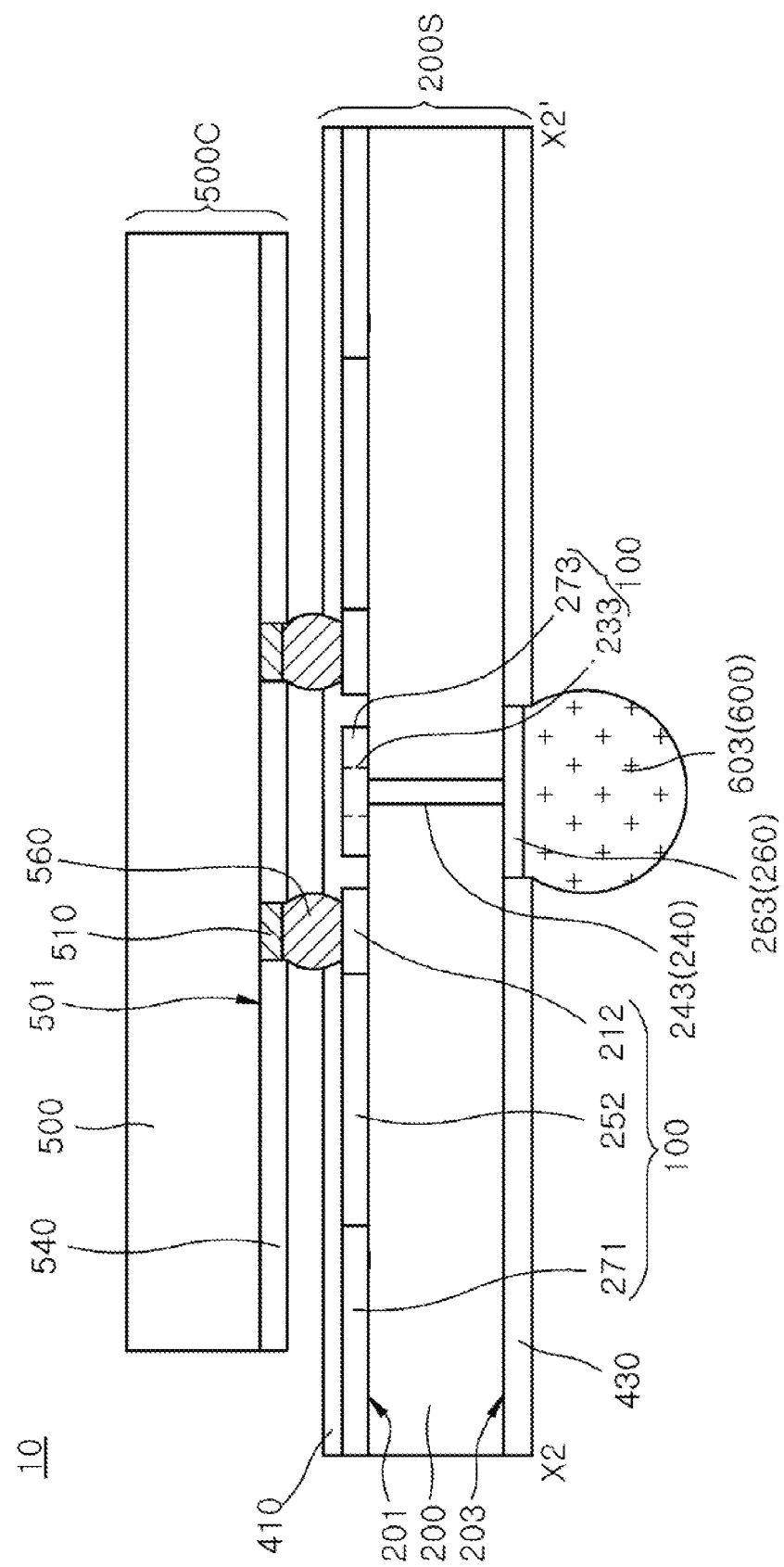
FIG. 3 shows a cross-sectional view of a semiconductor package taken along a line X2-X2' of FIG. 2.
Figure 4:
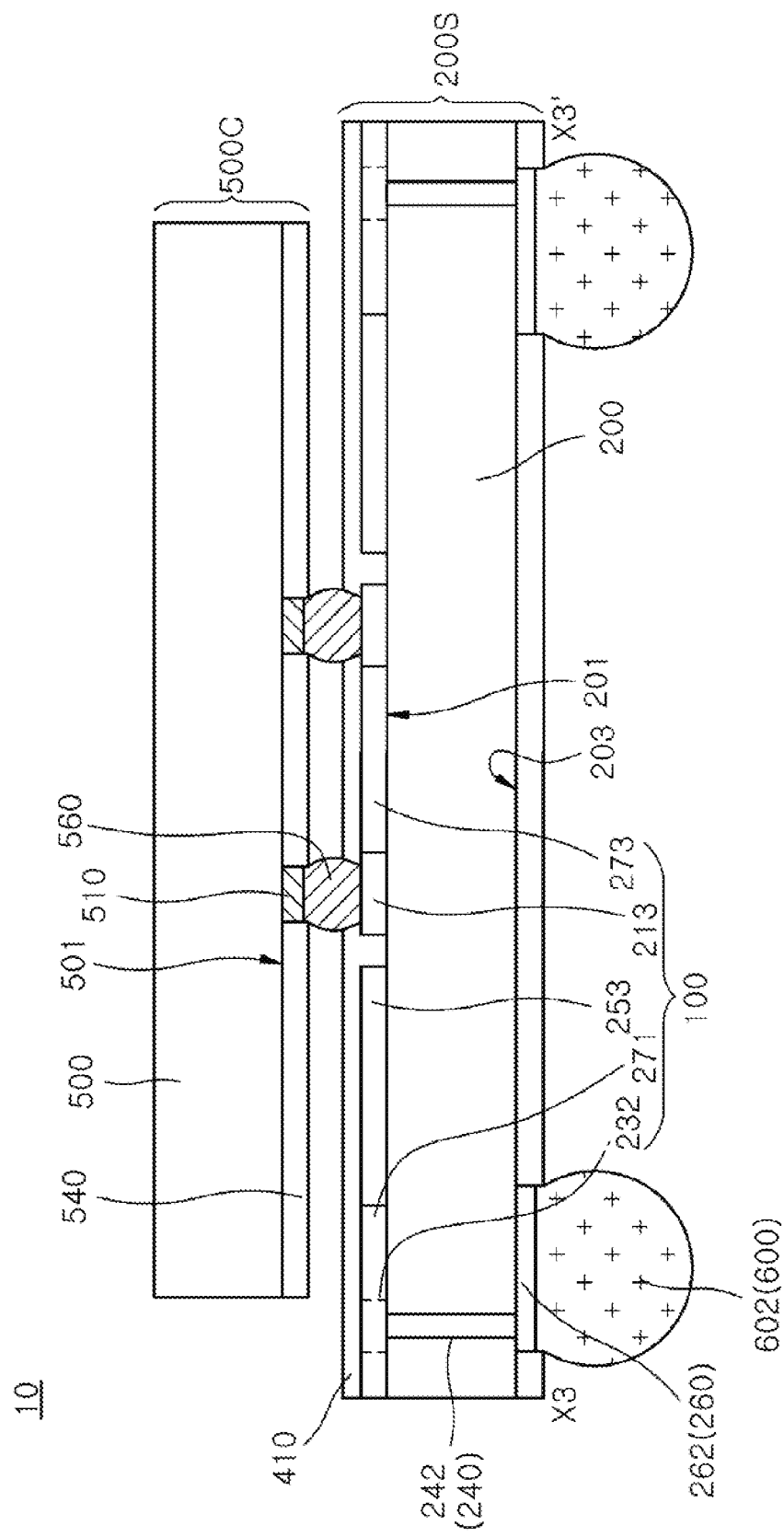
FIG. 4 shows a cross-sectional view of a semiconductor package taken along a line X3-X3' of FIG. 2.

FIG. 1 shows a cross-sectional view illustrating a semiconductor package 10, according to an embodiment. FIG. 2 shows a plan view illustrating a circuit interconnection structure 100 of a package substrate 200S included in the semiconductor package 10 of FIG. 1. FIG. 1 shows a cross-sectional view of the semiconductor package 10 including a cross-sectional view taken along a line X1-X1' of FIG. 2. FIG. 3 shows a cross-sectional view of the semiconductor package 10 including a cross-sectional view taken along a line X2-X2' of FIG. 2. FIG. 4 shows a cross-sectional view of the semiconductor package 10 including a cross-sectional view taken along a line X3-X3' of FIG. 2.

Referring to FIG. 1, the semiconductor package 10 may be configured to include the package substrate 200S and a semiconductor chip 500C. The semiconductor chip 500C may include a chip body 500 in or on which an integration circuit is formed. Chip pads 510 may be disposed on a surface 501 of the chip body 500. The chip pads 510 may include signal pads transmitting data signals to the semiconductor chip 500C or the package substrate 200S, a ground pad transmitting a ground voltage to the semiconductor chip 500C, and a power pad transmitting a power supply voltage to the semiconductor chip 500C.

The semiconductor chip 500C may be mounted on the package substrate 200S. The semiconductor chip 500C may be bonded to the package substrate 200S in a flip chip form such that the chip pads 510 of the semiconductor chip 500C face the package substrate 200S. The semiconductor chip 500C may be electrically connected to the package substrate 200S through inner connectors 560 located between the semiconductor chip 500C and the package substrate 200S. The inner connectors 560 may be bumps. A passivation layer 540 may be disposed on the surface 501 of the chip body 500 to expose the chip pads 510. The passivation layer 540 may be formed to include a dielectric layer.

The package substrate 200S may be an interconnection member that electrically connects the semiconductor chip 500C to an external device (not shown). The package substrate 200S may be embodied with a printed circuit board (PCB) structure.

The package substrate 200S may be configured to include the substrate body 200. The substrate body 200 may include a dielectric layer. The substrate body 200 may have a first surface 201 on which the semiconductor chip 500C is disposed and a second surface 203 located opposite to the semiconductor chip 500C. Outer connectors 600 may be attached to the second surface 203 of the substrate body 200. The outer connectors 600 may be interconnection members for electrically connecting the semiconductor package 10 to an external device. The outer connectors 600 may be interconnection members, for example, solder balls.

Outer connector landing portions 260 may be disposed on the second surface 203 of the substrate body 200. In such a case, the outer connectors 600 may be bonded to the outer connector landing portions 260. The outer connector landing portions 260 may be conductive patterns. A second dielectric layer 430 may be disposed on the second surface 203 of the substrate body 200 to reveal the outer connector landing portions 260. The second dielectric layer 430 may be formed to include a solder resist layer.

Conductive vias 240 may be disposed to vertically penetrate the substrate body 200. The conductive vias 240 may be electrically connected to the outer connector landing portions 260 disposed on the second surface 203 of the substrate body 200, respectively. The conductive vias 240 may be respectively disposed to overlap with the outer connector landing portions 260 in a plan view. Although not shown in the drawings, conductive connection trace portions may be additionally disposed on the second surface 203 of the substrate body 200 in order to electrically connect the conductive vias 240 to the outer connector landing portions 260 when the conductive vias 240 are disposed to be laterally offset relative to the outer connector landing portions 260.

The circuit interconnection structure 100 may be disposed on the first surface 201 of the substrate body 200. The circuit interconnection structure 100 may include conductive patterns. The circuit interconnection structure 100 may be disposed to electrically connect the conductive vias 240 to the inner connectors 560. The circuit interconnection structure 100 may be conductive patterns that electrically connect the conductive vias 240 to the semiconductor chip 500C. A first dielectric layer 410 may be disposed on the first surface 201 of the substrate body 200 to reveal portions of the circuit interconnection structure 100.

Referring to FIGS. 1 and 2, the circuit interconnection structure 100 disposed on the first surface 201 of the substrate body 200 may be configured to include first to fifth pad bonding portions 211, 212, 213, 214, and 215. The first to fifth pad bonding portions 211, 212, 213, 214, and 215 may be conductive patterns. The third, first, second, fourth and fifth pad bonding portions 213, 211, 212, 214, and 215 may be sequentially arrayed in a first column intersecting the line X1-X1' of FIG. 2. The circuit interconnection structure 100 may further include a plurality of sixth pad bonding portions 217, and the sixth pad bonding portions 217 may be sequentially arrayed in a second column spaced apart from the first column. The sixth pad bonding portions 217 may be arrayed to face the third, first, second, fourth and fifth pad bonding portions 213, 211, 212, 214, and 215, respectively.

The third, first, second, fourth, and fifth pad bonding portions 213, 211, 212, 214, and 215 may be electrically connected to the corresponding chip pads 510 of the semiconductor chip 500C, respectively. The sixth pad bonding portions 217 may also be electrically connected to the corresponding chip pads 510 of the semiconductor chip 500C, respectively. The third, first, second, fourth, and fifth pad bonding portions 213, 211, 212, 214, and 215 and the sixth pad bonding portions 217 may be respectively located at positions overlapping with the chip pads 510 of the semiconductor chip 500C in a plan view. The third, first, second, fourth and fifth pad bonding portions 213, 211, 212, 214, and 215 and the sixth pad bonding portions 217 may be electrically connected to the chip pads 510 of the semiconductor chip 500C through the inner connectors 560, respectively.

First to fourth via landing portions 231, 232, 233, and 234 may be disposed on the first surface 201 of the substrate body 200 to constitute a portion of the circuit interconnection structure 100. The first to fourth via landing portions 231, 232, 233, and 234 may be disposed to be spaced apart from the first to sixth pad bonding portions 211, 212, 213, 214, 215, and 217 when viewed from a plan view. The first to fourth via landing portions 231, 232, 233, and 234 may be disposed to overlap with the conductive vias (240 of FIG. 1) in a plan view. For example, as illustrated in FIG. 1, the first via landing portion 231 may be disposed to overlap with a first conductive via 241 included in the conductive vias 240 and may be electrically connected to the first conductive via 241.

First to third connection trace portions 251, 252 and 254 and first and second guard trace portions 253 and 255 may be disposed on the first surface 201 of the substrate body 200 to constitute a portion of the circuit interconnection structure 100. The first to third connection trace portions 251, 252, and 254 and first and second guard trace portions 253 and 255 may be line-shaped conductive patterns.

The first connection trace portion 251 may extend to connect the first pad bonding portion 211 to the first via landing portion 231. The second connection trace portion 252 may be connected to the second pad bonding portion 212 and may be disposed to be parallel with the first connection trace portion 251. The third connection trace portion 254 may extend to connect the fourth pad bonding portion 214 to the fourth via landing portion 234. The first to third connection trace portions 251, 252, and 254 may be disposed to be spaced apart from each other by a certain distance. The first to third connection trace portions 251, 252, and 254 may extend to be parallel with each other. In further embodiments, trace portions may be substantially parallel to one another. Substantially parallel means that the trace portions do not intersect or cross along their length.

The first guard trace portion 253 may be disposed such that an end portion 253E of the first guard trace portion 253 is spaced apart from and is adjacent to the third pad bonding portion 213. The first guard trace portion 253 may extend to be parallel with the first connection trace portion 251. The first guard trace portion 253 may be disposed at one side of the first connection trace portion 251 opposite to the second connection trace portion 252. The first guard trace portion 253 and the first connection trace portion 251 may be disposed side by side to be spaced apart from each other by a certain distance. The second guard trace portion 255 may be disposed such that an end portion 255E of the second guard trace portion 255 is spaced apart from and is adjacent to the fifth pad bonding portion 215. The second guard trace portion 255 may extend to be parallel with the third connection trace portion 254. The second guard trace portion 255 may be disposed at one side of the third connection trace portion 254 opposite to the second connection trace portion 252.

First and second connection plane portions 271 and 273 may be disposed on the first surface 201 of the substrate body 200 to constitute a portion of the circuit interconnection structure 100. The first and second connection plane portions 271 and 273 may be conductive patterns, each of which has a relatively large planar area as compared to the connection trace portions 251, 254 and the guard trace portions 253, 255. The first and second connection plane portions 271 and 273 may be conductive patterns which are electrically isolated from the first and fourth via landing portions 231 and 234.

In an embodiment, the first connection plane portion 271 may be disposed to be spaced apart from the first via landing portion 231 by a certain distance. The first connection plane portion 271 may be disposed to partially surround the first via landing portion 231 in a plan view. The first connection plane portion 271 may extend to connect the second connection trace portion 252 to the first guard trace portion 253 and to electrically bypass or circumvent the first via landing portion 231. The first connection plane portion 271 may further extend to connect the second connection trace portion 252 to the second via landing portion 232. The first connection plane portion 271 may be a conductive pattern including the second via landing portion 232. That is, the second via landing portion 232 may correspond to a portion of the first connection plane portion 271.

The first connection plane portion 271 may additionally extend to be spaced apart from the fourth via landing portion 234. The first connection plane portion 271 may extend to partially surround and electrically bypass or circumvent the fourth via landing portion 234 in a plan view. The first connection plane portion 271 may extend to connect the second connection trace portion 252 to the second guard trace portion 255. The first connection plane portion 271 may electrically connect the first and second guard trace portions 253 and 255 to the second via landing portion 232.

The second connection plane portion 273 may be disposed to connect the third pad bonding portion 213 to the third via landing portion 233. The second connection plane portion 273 may be configured to include the third via landing portion 233. That is, the third via landing portion 233 may correspond to a portion of the second connection plane portion 273. The second connection plane portion 273 may extend such that a side surface 273S of the second connection plane portion faces the first, second and fourth pad bonding portions 211, 212, and 214. The second connection plane portion 273 may further extend to connect the fifth pad bonding portion 215 to the third via landing portion 233. The second connection plane portion 273 may be disposed to be spaced apart from the first, second and fourth pad bonding portions 211, 212, and 214 by a certain distance. For example, the second connection plane portion 273 may partially surround and electrically bypass or circumvent the first, second, and fourth pad bonding portions 211, 212, and 214, as shown in the plan view of FIG. 2.

Referring to FIG. 2, the first guard trace portion 253 and the second connection trace portion 252 may be located at both sides of the first connection trace portion 251, respectively. As used herein for various embodiments, first and second portions respectively located at both sides of a third portion means that the third portion is located between the first and second portions. For example, the first guard trace portion 253 and the second connection trace portion 252 located at both sides of the first connection trace portion 251 means that the first connection trace portion 251 is located between the first guard trace portion 253 and the second connection trace portion 252. The second guard trace portion 255 and the second connection trace portion 252 may be located at both sides of the third connection trace portion 254, respectively. The first guard trace portion 253, the first connection trace portion 251, the second connection trace portion 252, the third connection trace portion 254, and the second guard trace portion 255 may be sequentially arrayed in a direction parallel with the first column. Accordingly, the third, first, second, fourth, and fifth pad bonding portions 213, 211, 212, 214, and 215 may also be sequentially arrayed in the first column.

The first guard trace portion 253 and the second connection plane portion 273 may be located at both sides of the third pad bonding portion 213, respectively. In addition, the first connection trace portion 251 and the second connection plane portion 273 may be located at both sides of the first pad bonding portion 211, respectively. Because the first via landing portion 231 is connected to the first connection trace portion 251 and the third via landing portion 233 is connected to the second connection plane portion 273, the first via landing portion 231 and the third via landing portion 233 may be located at both sides of the first pad bonding portion 211, respectively. For an embodiment, the first pad bonding portion 211 is located between the first via landing portion 231 and the third via landing portion 233.

The second connection trace portion 252 and the second connection plane portion 273 may be located at both sides of the second pad bonding portion 212, respectively. Because the second connection trace portion 252 is connected to the second via landing portion 232 through the first connection plane portion 271, the second via landing portion 232 and the third via landing portion 233 may be located at both sides of the second pad bonding portion 212, respectively. For an embodiment, the second pad bonding portion 212 is located between the second via landing portion 232 and the third via landing portion 233.

The second connection plane portion 273 may be located between a first column pad bonding portion including the first to fifth pad bonding portions 211, 212, 213, 214, and 215 arrayed in the first column and a second column pad bonding portion including the sixth pad bonding portions 217 arrayed in the second column. Thus, the first connection plane portion 271 and the second connection plane portion 273 may be located at both sides of the first column pad bonding portion including the first to fifth pad bonding portions 211, 212, 213, 214, and 215, respectively. For an embodiment, the first column in which the first to fifth pad bonding portions 211, 212, 213, 214, and 215 are arrayed is located between the first connection plane portion 271 and the second connection plane portion 273. In some cases, first sides of the first to fifth pad bonding portions 211, 212, 213, 214, and 215 face or are directed to the first connection plane portion 271 and the second via landing portion 232. Second sides of the first to fifth pad bonding portions 211, 212, 213, 214, and 215 face or are directed to the second connection plane portion 273 and the third via landing portion 233.

Referring to FIGS. 1 and 2, the first pad bonding portion 211, the first connection trace portion 251, and the first via landing portion 231 may constitute a first data signal line. The first data signal line may be a signal line transmitting a data signal to the semiconductor chip 500C. The first data signal line may further include the first conductive via 241, a first outer connector landing portion 261 included in the outer connector landing portions 260, and a first outer connector 601 included in the outer connectors 600 which are connected in series to the first via landing portion 231. Similarly, a second data signal line may include the fourth pad bonding portion 214, the third connection trace portion 254, and the fourth via landing portion 234.

Referring to FIGS. 2 and 3, the second pad bonding portion 212, the second connection trace portion 252, the first connection plane portion 271, and the second via landing portion 232 may constitute a ground line. The ground line may provide an electrical path for supplying a ground voltage to the semiconductor chip 500C. As illustrated in FIG. 4, the ground line may further include a second conductive via 242 included in the conductive vias 240, a second outer connector landing portion 262 included in the outer connector landing portions 260, and a second outer connector 602 included in the outer connectors 600 which are connected in series to the second via landing portion 232. The first and second guard trace portions 253 and 255 may also be electrically connected to the ground line through the first connection plane portion 271 to be grounded.

Referring to FIGS. 2 and 4, the third pad bonding portion 213, the second connection plane portion 273 and the third via landing portion 233 may constitute a first power line. The first power line may provide an electrical path for applying a power voltage to the semiconductor chip 500C. As illustrated in FIG. 3, the first power line may further include a third conductive via 243 included in the conductive vias 240, a third outer connector landing portion 263 included in the outer connector landing portions 260, and a third outer connector 603 included in the outer connectors 600 which are connected in series to the third via landing portion 233. The fifth pad bonding portion 215, the second connection plane portion 273, and the third via landing portion 233 may constitute a second power line.

Referring again to FIGS. 1 and 2, a data signal may be applied to the semiconductor chip 500C through the first data signal line including the first pad bonding portion 211, the first connection trace portion 251, and the first via landing portion 231. Variation of an impedance value of a signal path including the first connection trace portion 251 and the first via landing portion 231 may affect transmission of a data signal which is transmitted through the first connection trace portion 251 and the first via landing portion 231. However, according to the present embodiment, all of the first guard trace portion 253, the first connection plane portion 271, and the second connection trace portion 252 surrounding an electrical path including the first connection trace portion 251 and the first via landing portion 231 have the same ground potential. Thus, the impedance variation of the signal path including the first connection trace portion 251 and the first via landing portion 231 may be mitigated or suppressed.

The first guard trace portion 253, the first connection plane portion 271, and the second connection trace portion 252 may provide a continuous trace structure surrounding the first connection trace portion 251 and the first via landing portion 231. The first guard trace portion 253 may extend to be parallel with the first connection trace portion 251 and may be connected to the first connection plane portion 271. The first connection plane portion 271 may extend to surround the first via landing portion 231 and may be connected to the second connection trace portion 252. The second connection trace portion 252 may extend to be parallel with the first connection trace portion 251. Thus, the first guard trace portion 253, the first connection plane portion 271, and the second connection trace portion 252 may be connected in series to provide a continuous trace structure.

All of the first guard trace portion 253, the first connection plane portion 271, and the second connection trace portion 252 may be grounded, as described above. Accordingly, the structure including the first guard trace portion 253, the first connection plane portion 271, and the second connection trace portion 252 may act as a reference plane of the signal path including the first connection trace portion 251 and the first via landing portion 231. Thus, the structure including the first guard trace portion 253, the first connection plane portion 271, and the second connection trace portion 252 may function as a continuous signal return path without any discontinuous region or a continuous current return path without any discontinuous region for a data signal which is transmitted through the signal path including the first connection trace portion 251 and the first via landing portion 231.

As described above, no discontinuous region exists in the structure including the first guard trace portion 253, the first connection plane portion 271, and the second connection trace portion 252. Thus, the occurrence of the abrupt impedance variation of the signal path including the first connection trace portion 251 and the first via landing portion 231 may be mitigated, suppressed, or alleviated by the continuity of the structure including the first guard trace portion 253, the first connection plane portion 271, and the second connection trace portion 252. In addition, the first guard trace portion 253 and the first connection trace portion 251 may extend to be adjacent and parallel with each other. Accordingly, the impedance variation of the signal path including the first connection trace portion 251 and the first via landing portion 231 may be more significantly mitigated or suppressed.

If a discontinuous region exists in the structure including the first guard trace portion 253, the first connection plane portion 271, and the second connection trace portion 252, the discontinuous region may cause the abrupt impedance variation of the signal path including the first connection trace portion 251 and the first via landing portion 231. The abrupt impedance variation of the signal path including the first connection trace portion 251 and the first via landing portion 231 may affect the transmission of a data signal transmitted through the signal path including the first connection trace portion 251 and the first via landing portion 231. That is, the abrupt impedance variation of the signal path may disturb the transmission of a data signal transmitted through the signal path.

A power signal having a logic "high" level may be supplied to the semiconductor chip 500C through the third pad bonding portion 213. A first data signal may be transmitted through the first pad bonding portion 211. A ground signal having a logic "low" level may be supplied to the semiconductor chip 500C through the second pad bonding portion 212. Thus, the first, second and third pad bonding portions 211, 212, and 213 may respectively function as a power pad, a signal pad, and a ground pad and may be disposed to be adjacent to each other. That is, the first, second, and third pad bonding portions 211, 212, and 213 may be disposed to be substantially closest to each other. Accordingly, routing distances between the power signal, the data signal, and the ground signal, which are applied to the semiconductor chip 500C, may be reduced to improve an operation speed of the semiconductor chip 500C.

Buffer circuits for the data signals, the power signal, and the ground signal may be provided in or on the chip body (500 of FIG. 1) of the semiconductor chip (500C of FIG. 1). The buffer circuits may be configured to perform a switching operation. Because the power pad, the signal pads, and the ground pads are disposed to be adjacent to each other, routing distances of the power line, the data lines, and the ground line connected to the buffer circuits may be reduced. Thus, an operation speed of the buffer circuits may be improved.

Referring again to FIG. 2, the sixth pad bonding portions 217 arrayed in the second column may be disposed to have a symmetric configuration to the first to fifth pad bonding portions 211-215 arrayed in the first column with respect to a straight line between the first and second columns. However, in some other embodiments, the sixth pad bonding portions 217 may be randomly disposed at arbitrary positions to have a non-symmetric configuration to the first to fifth pad bonding portions 211-215.

In FIG. 2, although a third connection plane portion 275 is disposed to have a symmetric configuration to the first connection plane portion 271 with respect to a straight line between the first and second columns, the third connection plane portion 275 may be disposed to have a non-symmetric configuration to the first connection plane portion 271 according to other embodiments.

In FIG. 2, although a third guard trace portion 293 and a fourth guard trace portion 295 are disposed to have a symmetric configuration to the first and second guard trace portions 253 and 255 with respect to a straight line between the first and second columns, the third guard trace portion 293 and the fourth guard trace portion 295 may be disposed to have a non-symmetric configuration to the first and second guard trace portions 253 and 255 according to other embodiments.

In FIG. 2, although a fourth connection trace portion 291, a fifth connection trace portion 292, and a sixth connection trace portion 294 are disposed to have a symmetric configuration to the first, second, and third connection trace portions 251, 252, and 254 with respect to a straight line between the first and second columns, the fourth connection trace portion 291, the fifth connection trace portion 292, and the sixth connection trace portion 294 may be disposed to have a non-symmetric configuration to the first, second and third connection trace portions 251, 252, and 254 according to other embodiments.

In FIG. 2, although a fifth via landing portion 281, a sixth via landing portion 282, and a seventh via landing portion 284 are disposed to have a symmetric configuration to the first, second, and fourth via landing portions 231, 232, and 234 with respect to a straight line between the first and second columns, the fifth via landing portion 281, the sixth via landing portion 282, and the seventh via landing portion 284 may be disposed to have a non-symmetric configuration according to other embodiments.

Figure 5:
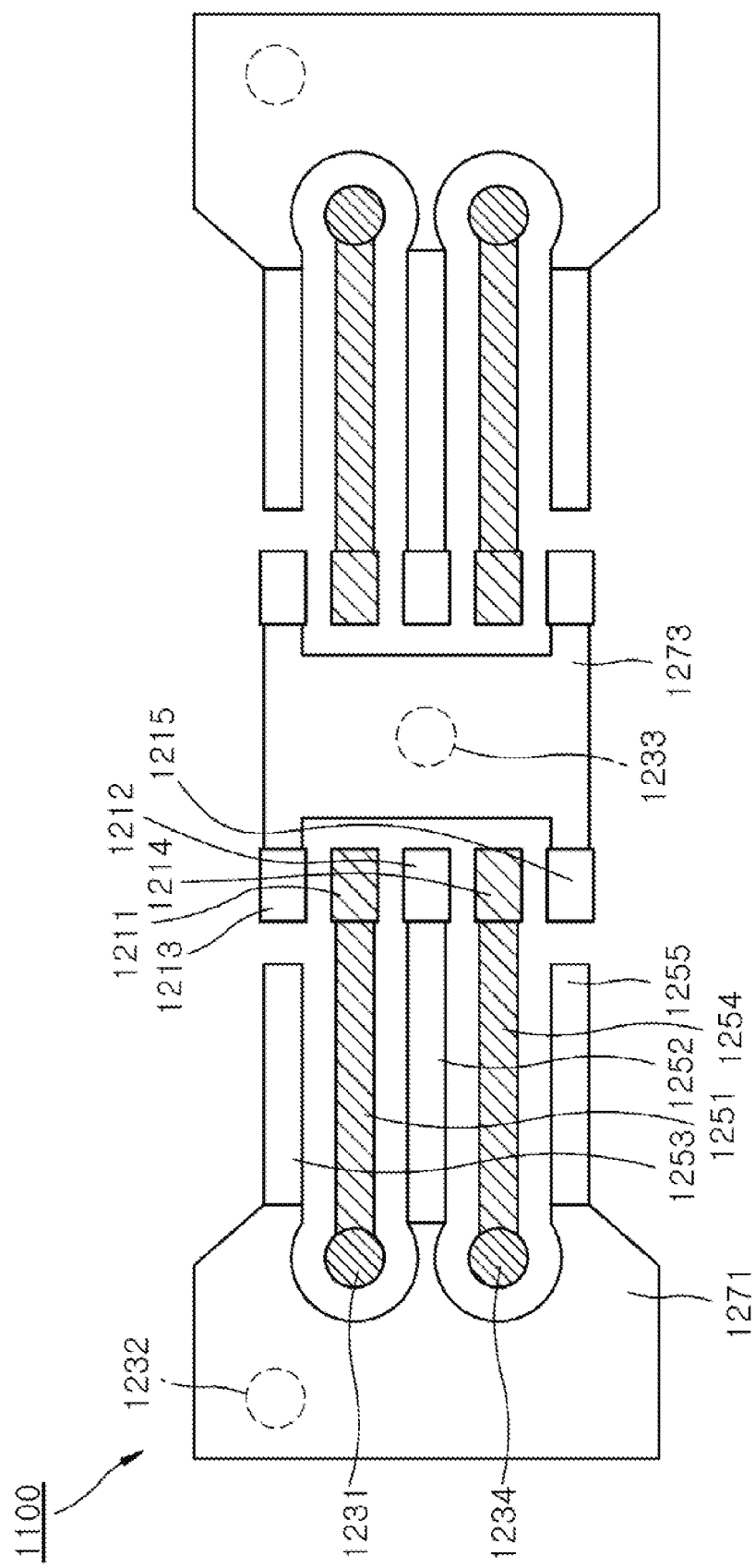
FIG. 5 shows a plan view illustrating a circuit interconnection structure of a semiconductor package, according to an embodiment.

FIG. 5 shows a plan view illustrating another circuit interconnection structure 1100 employed in a semiconductor package, according to an embodiment.

Referring to FIG. 5, the circuit interconnection structure 1100 may include first to fifth pad bonding portions 1211, 1212, 1213, 1214, and 1215; first to third connection trace portions 1251, 1252 and 1254; first and second guard trace portions 1253 and 1255; first to fourth via landing portions 1231, 1232, 1233, and 1234; and first and second connection plane portions 1271 and 1273.

The first pad bonding portion 1211, the first connection trace portion 1251, and the first via landing portion 1231 may constitute a first data signal line. The fourth pad bonding portion 1214, the third connection trace portion 1254, and the fourth via landing portion 1234 may constitute a second data signal line.

The second pad bonding portion 1212, the second connection trace portion 1252, the first connection plane portion 1271, and the second via landing portion 1232 may constitute a power line. The first and second guard trace portions 1253 and 1255 may also be electrically connected to the first connection plane portion 1271 to act as a portion of the power line. When a first data signal is transmitted through the first via landing portion 1231 and the first connection trace portion 1251, the first guard trace portion 1253, the second connection trace portion 1252, and the first connection plane portion 1271 may act as a signal return path. The first guard trace portion 1253, the second connection trace portion 1252, and the first connection plane portion 1271 may be provided to suppress the impedance variation of the first connection trace portion 1251 or to reduce an amount of the impedance variation of the first connection trace portion 1251. When a second data signal is transmitted through the fourth via landing portion 1234 and the third connection trace portion 1254, the second guard trace portion 1255, the second connection trace portion 1252, and the first connection plane portion 1271 may act as a signal return path. The second guard trace portion 1255, the second connection trace portion 1252, and the first connection plane portion 1271 may be provided to suppress the impedance variation of the third connection trace portion 1254 or to reduce an amount of the impedance variation of the third connection trace portion 1254.

The third pad bonding portion 1213, the second connection plane portion 1273, and the third via landing portion 1233 may constitute a first ground line. The fifth pad bonding portion 1215, the second connection plane portion 1273, and the third via landing portion 1233 may constitute a second ground line.

Figure 6:
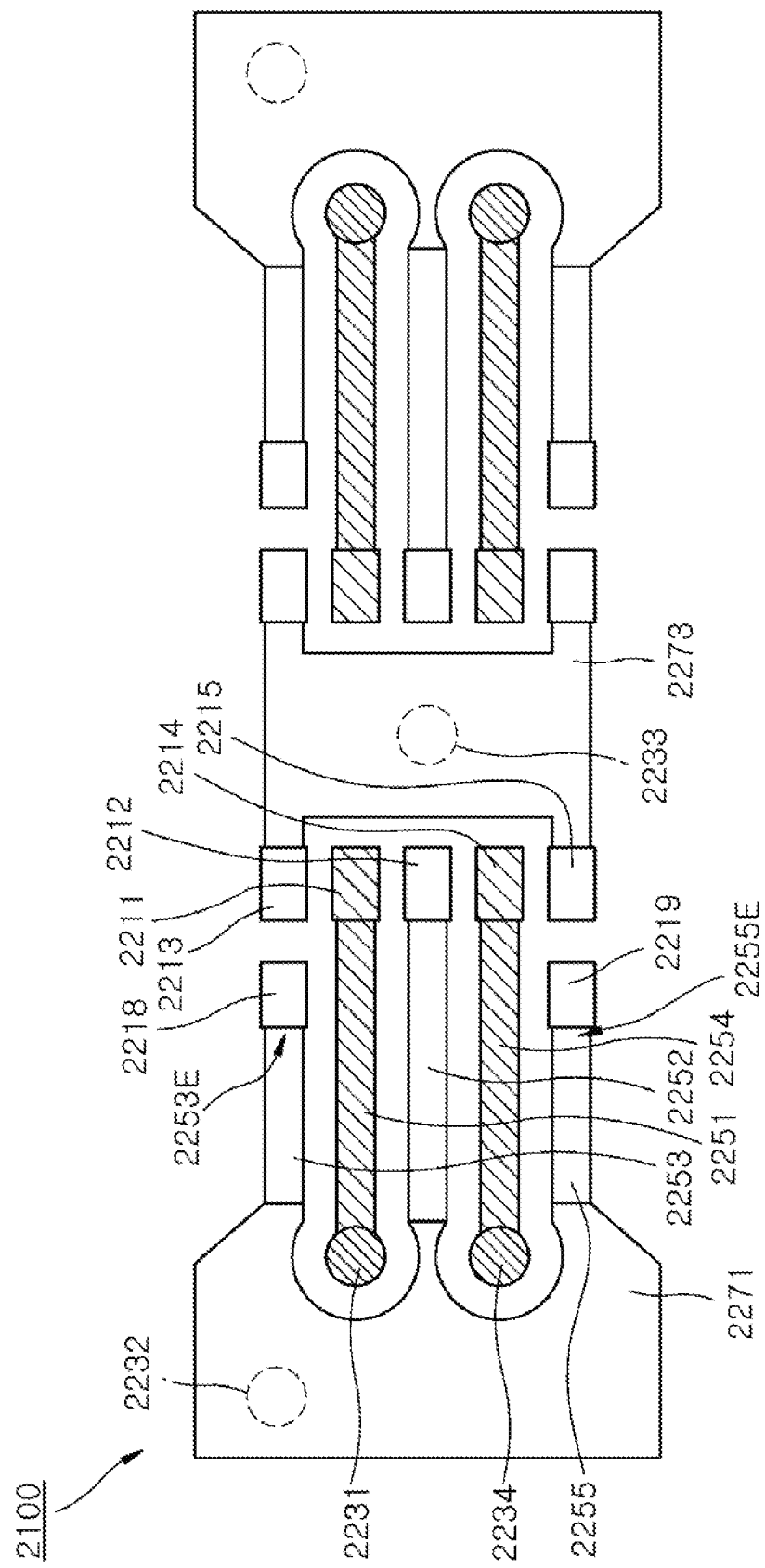
FIG. 6 shows a plan view illustrating a circuit interconnection structure of a semiconductor package, according to an embodiment.

FIG. 6 shows a plan view illustrating yet another circuit interconnection structure 2100 employed in a semiconductor package, according to an embodiment.

Referring to FIG. 6, the circuit interconnection structure 2100 may include first to fifth pad bonding portions 2211, 2212, 2213, 2214, and 2215; first to third connection trace portions 2251, 2252, and 2254; first and second guard trace portions 2253 and 2255; first to fourth via landing portions 2231, 2232, 2233, and 2234; and first and second connection plane portions 2271 and 2273.

A first additional pad bonding portion 2218 may be connected to an end portion 2253E of the first guard trace portion 2253 to face the third pad bonding portion 2213. The first additional pad bonding portion 2218 may have substantially the same shape as the third pad bonding portion 2213 facing the first additional pad bonding portion 2218. An additional inner connector (not shown), for example, having the same shape as the inner connectors (560 of FIG. 1), may be bonded to the first additional pad bonding portion 2218. Thus, the first additional pad bonding portion 2218 may be electrically connected to the semiconductor chip (500C of FIG. 1).

A second additional pad bonding portion 2219 may be connected to an end portion 2255E of the second guard trace portion 2255 to face the fifth pad bonding portion 2215. The second additional pad bonding portion 2219 may have substantially the same shape as the fifth pad bonding portion 2215 facing the second additional pad bonding portion 2219. An additional inner connector (not shown), for example, having the same shape as the inner connectors (560 of FIG. 1), may be bonded to the second additional pad bonding portion 2219. Thus, the second additional pad bonding portion 2219 may also be electrically connected to the semiconductor chip (500C of FIG. 1).

Figure 7:
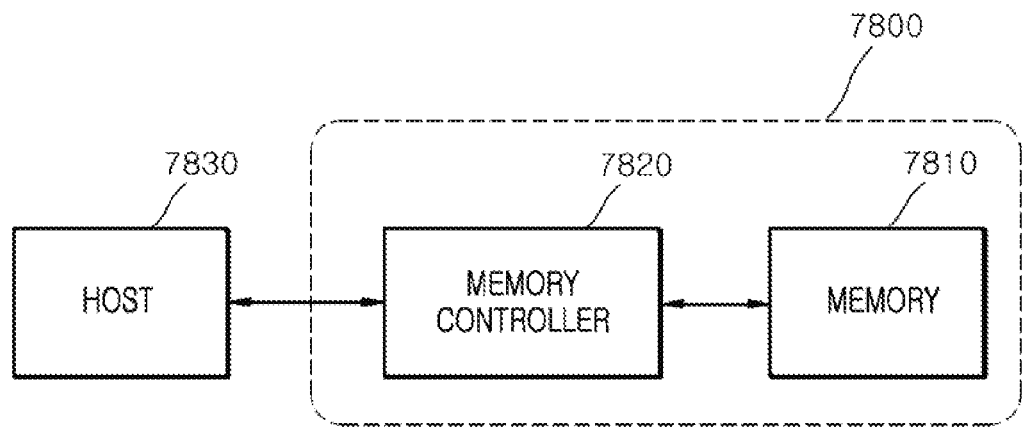
FIG. 7 shows a block diagram illustrating an electronic system employing a memory card including a semiconductor package, according to an embodiment.

FIG. 7 shows a block diagram illustrating an electronic system including a memory card 7800 employing a semiconductor package according to an embodiment of the present disclosure. The memory card 7800 includes a memory 7810, such as a nonvolatile memory device, and a memory controller 7820. The memory 7810 and the memory controller 7820 may store data or read out stored data. At least one of the memory 7810 and the memory controller 7820 may include a semiconductor package according to an embodiment.

The memory 7810 may include a nonvolatile memory device to which the teachings of the embodiment of the present disclosure are applied. The memory controller 7820 may control the memory 7810 such that stored data is read out or data is stored in response to a read/write request from a host 7830.

Figure 8:
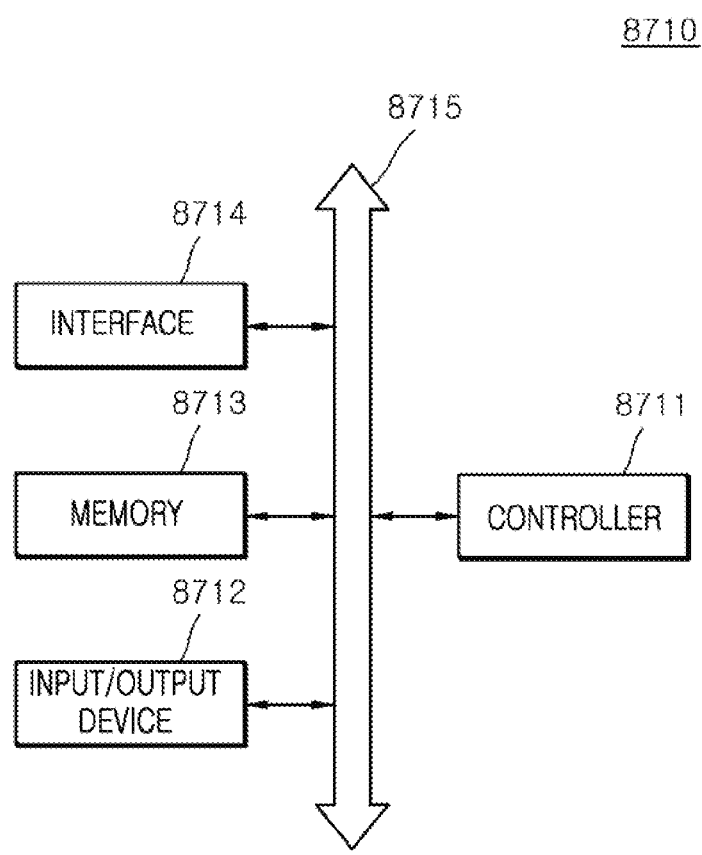
FIG. 8 shows a block diagram illustrating an electronic system including a semiconductor package, according to an embodiment.

FIG. 8 shows a block diagram illustrating an electronic system 8710 including a semiconductor package according to an embodiment of the present disclosure. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more of a microprocessor, digital signal processor, microcontroller, and/or logic device capable of performing the same functions as these components. The controller 8711 and/or the memory 8713 may include one or more of the semiconductor packages according to an embodiment of the present disclosure. The input/output device 8712 may include at least one selected among a keypad, a keyboard, a display device, a touchscreen, and so forth. The memory 8713 is a device for storing data. The memory 8713 may store data and/or commands to be executed by the controller 8711, and the like.

The memory 8713 may include a volatile memory device, such as a DRAM, and/or a nonvolatile memory device, such as a flash memory. For example, a flash memory may be mounted to an information processing system, such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

A limited number of possible embodiments for the present disclosure have been disclosed for illustrative purposes. Those skilled in the art will appreciate that various modifications, additions, and substitutions are possible with respect to the presented embodiments without departing from the scope and spirit of the present disclosure and the accompanying claims.

What is claimed is:

1. A semiconductor package comprising:
a package substrate including a substrate body; and
a semiconductor chip mounted on the package substrate,
wherein the package substrate comprises:
first, second, and third pad bonding portions disposed on the substrate body, wherein the first pad bonding portion is located between the second and the third pad bonding portions;
first, second, and third via landing portions disposed on the substrate body to be spaced apart from the first, second, and third pad bonding portions;
a first connection trace portion extending to connect the first pad bonding portion to the first via landing portion;
a second connection trace portion connected to the second pad bonding portion, the second connection trace portion substantially parallel with the first connection trace portion;
a first guard trace portion having an end portion spaced apart from the third pad bonding portion and extending to be substantially parallel with the first connection trace portion;
a first connection plane portion spaced apart from the first via landing portion, surrounding and not being electrically connected to the first via landing portion to connect the second connection trace portion to the first guard trace portion, and connecting the second connection trace portion to the second via landing portion; and
a second connection plane portion connecting the third pad bonding portion to the third via landing portion.

2. The semiconductor package of claim 1, wherein the first connection trace portion is located between the first guard trace portion and the second connection trace portion.

3. The semiconductor package of claim 1, wherein the third pad bonding portion is located between the first guard trace portion and the second connection plane portion.

4. The semiconductor package of claim 1, wherein the first pad bonding portion is located between the first connection trace portion and the second connection plane portion.

5. The semiconductor package of claim 1, wherein the second pad bonding portion is located between the second connection trace portion and the second connection plane portion.

6. The semiconductor package of claim 1, wherein the first guard trace portion is spaced apart from the first connection trace portion.

7. The semiconductor package of claim 1, wherein the first connection plane portion is spaced apart from the first via landing portion.

8. The semiconductor package of claim 1,
wherein the first, second, and third pad bonding portions are located between the first via landing portion and the third via landing portion.

9. The semiconductor package of claim 1,
wherein the first, second, and third pad bonding portions are located between the second via landing portion and the third via landing portion.

10. The semiconductor package of claim 1,
wherein the first, second, and third pad bonding portions are located between the first connection plane portion and the second connection plane portion.

11. The semiconductor package of claim 1, wherein the first via landing portion, the first connection trace portion, and the first pad bonding portion constitute a data signal line for transmitting a data signal to the semiconductor chip.

12. The semiconductor package of claim 11, wherein the second via landing portion, the first connection plane portion, the second connection trace portion, and the second pad bonding portion constitute a ground line for supplying a ground voltage to the semiconductor chip.

13. The semiconductor package of claim 12, wherein the third via landing portion, the second connection plane portion, and the third pad bonding portion constitute a power line for supplying a power voltage to the semiconductor chip.

14. The semiconductor package of claim 11, wherein the second via landing portion, the first connection plane portion, the second connection trace portion, and the second pad bonding portion constitute a power line for supplying a power voltage to the semiconductor chip.

15. The semiconductor package of claim 14, wherein the third via landing portion, the second connection plane portion, and the third pad bonding portion constitute a ground line for supplying a ground voltage to the semiconductor chip.

16. The semiconductor package of claim 1, further comprising an additional pad bonding portion connected to an end portion of the first guard trace portion to face the third pad bonding portion.

17. The semiconductor package of claim 1, further comprising:
fourth and fifth pad bonding portions disposed on the substrate body;
a fourth via landing portion disposed on the substrate body to be spaced apart from the fourth pad bonding portion;
a third connection trace portion extending to connect the fourth pad bonding portion to the fourth via landing portion; and
a second guard trace portion having an end portion spaced apart from the fifth pad bonding portion and extending to be substantially parallel with the third connection trace portion,
wherein the first connection plane portion surrounds while being spaced apart from and not electrically contacting the fourth via landing portion to connect the second connection trace portion to the second guard trace portion, and
wherein the second connection plane portion connects the fifth pad bonding portion to the third via landing portion.

18. The semiconductor package of claim 17, wherein the first, second, third, fourth, and fifth pad bonding portions are arrayed in a first column.

19. The semiconductor package of claim 18, further comprising a plurality of sixth pad bonding portions disposed on the substrate body and arrayed in a second column which is spaced apart from the first column,
wherein the second connection plane portion is located between the first column and the second column.

20. The semiconductor package of claim 19, wherein the third via landing portion is located between the first column and the second column.

* * * * *